(12) United States Patent
Morishima

(10) Patent No.: US 6,310,421 B2
(45) Date of Patent: *Oct. 30, 2001

(54) SURFACE ACOUSTIC WAVE DEVICE AND METHOD FOR FABRICATING THE SAME

(75) Inventor: Koji Morishima, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/231,836

(22) Filed: Jan. 15, 1999

(30) Foreign Application Priority Data

Oct. 5, 1998 (JP) .................................. 10-282814

(51) Int. Cl.[7] .................................................. H01L 41/08
(52) U.S. Cl. ...................... 310/313 R; 310/340; 310/348
(58) Field of Search .............................. 310/313 R, 340, 310/344, 348

(56) References Cited

U.S. PATENT DOCUMENTS

| | | | |
|---|---|---|---|
| 4,086,696 | * 5/1978 | Ikuta | 310/340 X |
| 4,699,682 | * 10/1987 | Takishima | 310/313 R X |
| 5,702,775 | * 12/1997 | Anderson et al. | 310/340 X |
| 5,705,964 | 1/1998 | Tera et al. | 333/193 |
| 5,821,665 | * 10/1998 | Onishi et al. | 310/313 R |
| 5,831,369 | * 11/1998 | Furbacher et al. | 310/313 R |
| 5,892,417 | * 4/1999 | Johnson et al. | 310/340 X |
| 5,920,142 | * 7/1999 | Onishi et al. | 310/313 R |
| 5,939,817 | * 8/1999 | Takado | 310/348 |
| 5,969,461 | * 10/1999 | Anderson et al. | 310/313 R |
| 6,078,123 | * 6/2000 | Tanaka et al. | 310/313 R |
| 6,094,988 | * 8/2000 | Aindow | 310/313 R |

FOREIGN PATENT DOCUMENTS

| | | | |
|---|---|---|---|
| 0139514 | * 8/1983 | (JP) | 310/344 |
| 4343513 | 11/1992 | (JP) | . |
| 8181564 | 7/1996 | (JP) | . |

\* cited by examiner

Primary Examiner—Mark O. Budd
(74) Attorney, Agent, or Firm—Rothwell, Figgs, Ernst & Manbeck

(57) ABSTRACT

A surface acoustic wave device that is small, lightweight and highly reliable, and protects its functional portion. The surface acoustic wave device has surface acoustic wave elements mounted on a circuit substrate. Each surface acoustic wave element includes a frame-like first insulating film furnished to surround functional portions on a chip, and a lid-like second insulating film deposited on the first insulating film so as to cover driving electrodes and surface wave propagation paths of the functional portions, while securing a hollow portion over the functional portions.

4 Claims, 7 Drawing Sheets

SURFACE ACOUSTIC WAVE DEVICE AND METHOD FOR FABRICATING THE SAME

BACKGROUND OF THE INVENTION

1. Field of the Invention

The present invention relates to a surface acoustic wave device used as a high-frequency oscillator in telecommunication equipment as well as to a method for fabricating the device.

2. Description of Related Art

Figure 10:
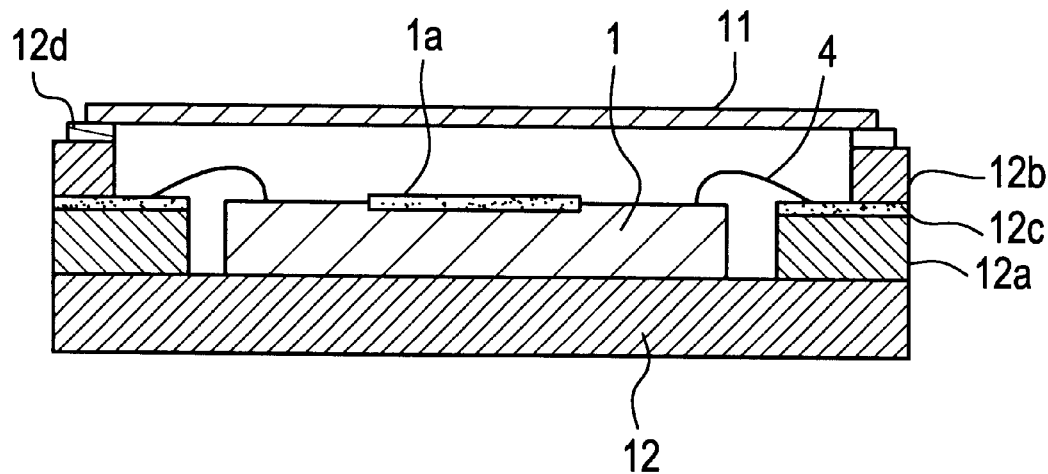

FIG. 10 is a cross-sectional view of a conventional surface acoustic wave device. In FIG. 10, reference numeral 1 denotes a piezoelectric substrate (called the chip hereunder) constituting a surface acoustic wave element. On a principal plane of the chip 1 (upper surface in FIG. 10) are a surface acoustic wave functional portion 1a and electrode pads (the latter not shown). The functional portion 1a comprises driving electrodes made of known finger-shaped inter-digital transducers (called IDTs hereunder), and propagation paths for surface waves driven in a predetermined direction on the chip surface. The electrode pads extend from the driving electrodes and serve as external connection terminals of the functional portion 1a. Reference numeral 12 denotes a package that holds the chip 1, and 12a and 12b denote package side walls that surround the chip thereby constituting a chip holder. Part of the side wall 12a includes a terminal portion 12c serving as external connectors. Reference numeral 4 denotes wires for electrically connecting the electrode pads of the functional portion 1a to the terminal portion 12c.

Reference numeral 11 denotes a metal cover connected to a sealing portion 12d placed on the top surface of the package side wall 12b, whereby the functional portion 1a of the chip 1 is sealed in an airtight and protected 30 manner. In order to release acoustically both the surface waves driven by the known IDTs and the propagation paths for the waves, the surface acoustic wave device requires that a hollow portion be secured over the surface of the functional portion 1a and that protective measures be taken to prevent breakdown of the functional portion 1a.

Figure 11:
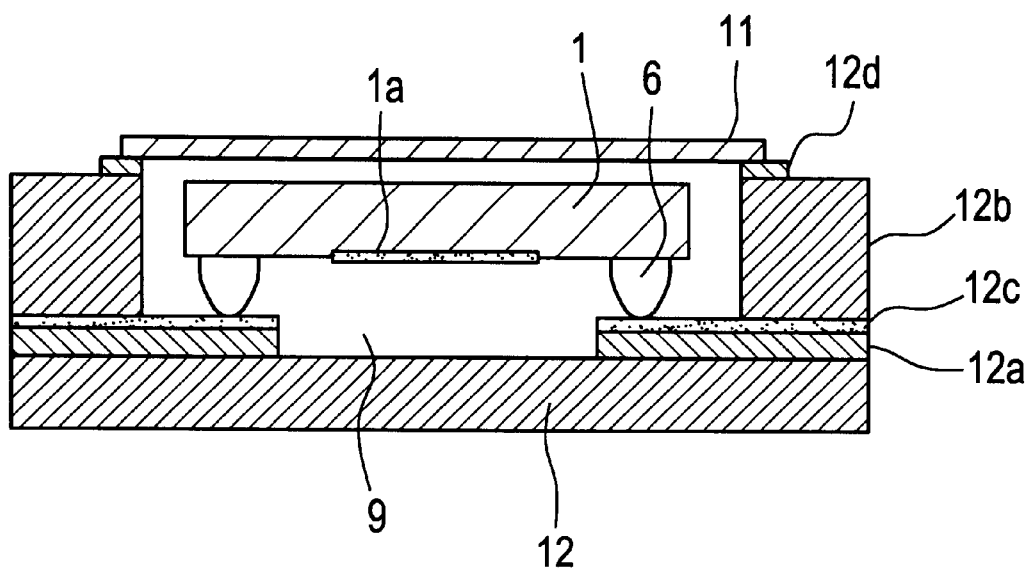

FIG. 11 is a cross-sectional view of another conventional surface acoustic wave device disclosed in Japanese Patent Application Laid-open No. (Hei)4-301910. In FIG. 11, those parts with their counterparts already shown in FIG. 10 are given the same reference numerals, and descriptions of such parts are omitted where they are repetitive.

The device in FIG. 11 has the functional portion 1a furnished at the bottom of the chip 1, with a hollow portion formed between the functional portion 1a and the package 12. Bump electrodes 6 connect the functional portion 1a with the terminal portion 12c. That is, electrical connections between the portions 1a and 12c are secured by connecting the bump electrodes 6, formed on electrode pads not shown, to the terminal portion 12c. The package side wall 12a creates a staggered portion opposite to the functional portion 1a and also contributes to providing the hollow portion 9. The setup protects the functional portion 1a and secures a clearance over its surface. As in the case of the device in FIG. 10, the metal cover 11 on top of the chip 1 seals the opening of the package 12 airtight with the sealing portion 12d interposed therebetween.

Conventional surface acoustic wave devices are typically constituted as outlined above. In such devices, the cover 11 made of metal has been used for airtight sealing. When an alternative insulating resin, although less expensive, is used to surround the chip 1 periphery, the resin adheres on the chip 1 and makes it impossible to secure a hollow portion over the surface of the functional portion 1a. Meanwhile, the use of the metal cover pushed up manufacturing costs of the surface acoustic wave device, a disadvantage that has plagued the prior art.

It is therefore an object of the present invention to overcome the above and other deficiencies of the prior art and to provide a surface acoustic wave device that is small, lightweight, highly reliable, and is protected against breakdown of its functional portion with a hollow segment secured over the surface of that functional portion.

It is another object of the present invention to provide a method for fabricating a surface acoustic wave device in ways that are simpler, more efficient, more accurate and less expensive than before.

SUMMARY OF THE INVENTION

According to a first aspect of the present invention, there is provided a surface acoustic wave device having surface acoustic wave elements mounted on a circuit substrate, each of the surface acoustic wave elements comprises a piezoelectric substrate, a functional portion which is formed on one principal plane of the piezoelectric substrate and which has driving electrodes for driving surface waves in a predetermined direction over a surface of the piezoelectric substrate, a frame-like first insulating film furnished to the one principal plane of the piezoelectric substrate so as to surround the functional portion and a lid-like second insulating film for covering the driving electrodes and surface wave propagation paths of the functional portion while securing a predetermined space over the functional portion.

Here, the surface acoustic wave device may further comprise bump electrodes which are formed on either the one principal plane or other principal plane of the piezoelectric substrate and which constitute external connectors of the surface acoustic wave elements, wherein the surface acoustic wave elements are connected via the bump elements to the circuit substrate in flip-chip bonding fashion.

According to a second aspect of the present invention, there is provided a surface acoustic wave device having surface acoustic wave elements mounted on a circuit substrate, each of the surface acoustic wave elements comprises a piezoelectric substrate, a functional portion which is formed on one principal plane of the piezoelectric substrate and which has driving electrodes for driving surface waves in a predetermined direction over a surface of the piezoelectric substrate, bump electrodes which are formed on the one principal plane of the piezoelectric substrate and which constitute external connectors of the functional portion and a first insulating film deposited on the one principal plane of the piezoelectric substrate except where there exist at least the functional portion and the bump electrodes, wherein the bump electrodes of the surface acoustic wave elements are connected to the circuit substrate in flip-chip bonding fashion, with an anisotropic conductor interposed between the bump electrodes and the circuit substrate.

Here, the surface acoustic wave device may further comprise a second insulating film deposited on the first insulating film so as to secure a predetermined space over the functional portion while covering the driving electrodes and surface wave propagation paths of the functional portion except where there exist at least the bump electrodes.

According to a third aspect of the present invention, there is provided a method for fabricating a surface acoustic wave device, the method comprises the steps of forming functional portions of a plurality of surface acoustic wave elements on one principal plane of a piezoelectric substrate, the function portions including driving electrodes for driving surface waves in a predetermined direction over a surface of the piezoelectric substrate, depositing a first insulating film on the one principal plane of the piezoelectric substrate except where there exist at least the functional portions and electrode pads for use by bump electrodes, depositing a second insulating film in lid fashion over the functional portions except where there exist at least the electrode pads on the first insulating film so as to secure a predetermined space while covering the driving electrodes and surface wave propagation paths of the functional portions, furnishing each of the functional portions with the bump electrodes constituting external connectors of the functional portions on the one principal plane of the piezoelectric substrate, providing a single anisotropic conductor so as to cover the plurality of the functional portions and each of the bump electrodes, connecting the bump electrodes to the circuit substrate in flip-chip bonding fashion and separating the surface acoustic wave elements into individual elements.

The above and other objects, effects, features and advantages of the present invention will become more apparent from the following description of the embodiments thereof taken in conjunction with the accompanying

DETAILED DESCRIPTION OF THE PREFERRED EMBODIMENTS

Embodiments of the present invention will be described below with reference to the accompanying drawings. It is noted that the same reference symbols in the drawings denote the same or corresponding components.

Embodiment 1

Figure 1:
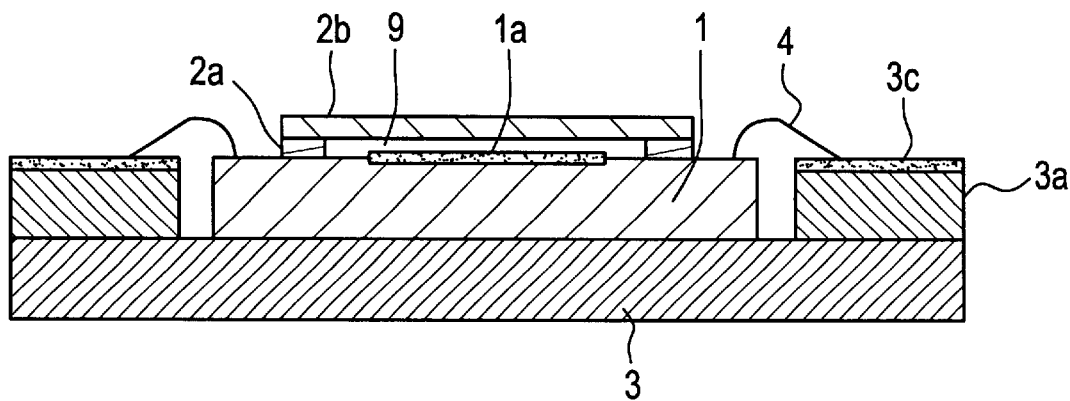

An embodiment 1 of this invention will now be described with reference to FIG. 1. FIG. 1 is a cross-sectional view of a surface acoustic wave device according to embodiment 1.

In FIG. 1, reference numeral 1 denotes a piezoelectric substrate chip constituting a surface acoustic wave element. On a principal plane of the chip 1 (upper surface in FIG. 1) are a surface acoustic wave functional portion 1a and electrode pads (not shown). The functional portion 1a comprises driving electrodes made of known IDTs, and propagation paths for surface waves driven in a predetermined direction on the chip surface. The electrode pads, extend from the driving electrodes and serve as external connection terminals of the functional portion 1a.

Reference numeral 3 denotes a circuit substrate on which to mount the chip; 3c for a terminal portion formed on a part of the circuit substrate 3; 4 for wires that connect the electrode pads of the functional portion 1a electrically to the terminal portion 3c; 2a for a frame-like first insulating film deposited on the upper surface of the chip 1 surrounding the functional portion 1a on the chip 1; and 2b for a lid-like second insulating film attached to the first insulating film 2a in covering relation therewith. The second insulating film 2b ensures a suitable hollow portion 9 over the functional portion 1a and protectively envelopes the driving electrodes and surface acoustic wave propagation paths of the functional portion 1a.

In the surface acoustic wave device of the above constitution, the crucially important functional portion 1a is protected by the first and the second insulating film 2a and 2b with the hollow portion 9 interposed therebetween. The makeup allows the chip 1 to be fabricated in a secure manner with little risk of getting the functional portion 1a inadvertently damaged during the process.

Because the first and the second insulating film 2a and 2b seal the functional portion 1a in a simplified fashion, it is not mandatory, as with conventional surface acoustic wave devices, to provide costly airtight sealing on the functional portion. The result is an inexpensively manufactured surface acoustic wave device.

Embodiment 2

Figure 2:
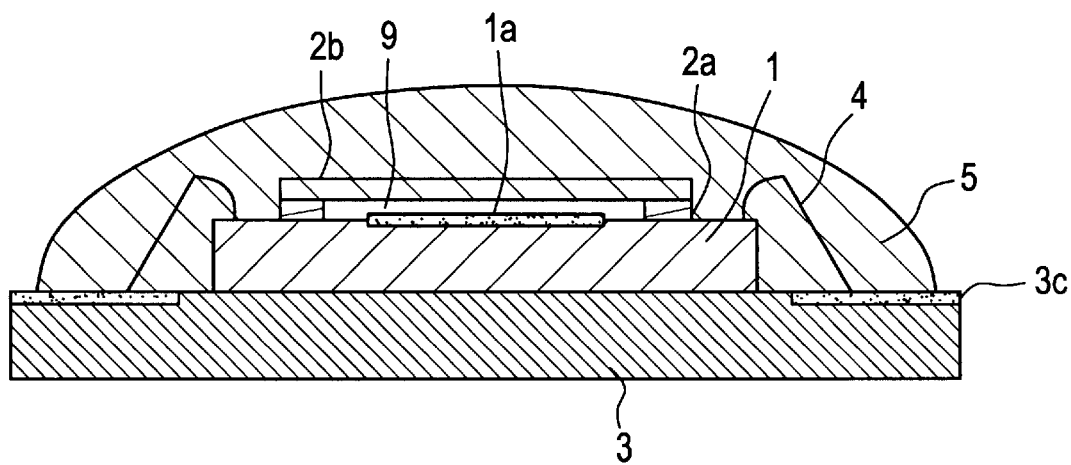

An embodiment 2 of the invention will now be described with reference to FIG. 2. FIG. 2 is a cross-sectional view of a surface acoustic wave device according to embodiment 2. In FIG. 2, those parts with their counterparts already shown in FIG. 1 are given the same reference numerals, and descriptions of such parts are omitted where they are repetitive.

In FIG. 2, reference numeral 5 represents an insulating resin. The chip 1, with its functional portion 1a capped by the first and the second insulating film 2a and 2b, is mounted on the circuit substrate 3. Metal wires 4 are used to connect the functional portion 1a electrically to the terminal portion 3c. The insulating resin 5 is deposited so as to cover the chip 1 and metal wires 4. This makeup ensures the same effects as the embodiment 1 and provides a surface acoustic wave device still more reliable than the embodiment 1.

Embodiment 3

An embodiment 3 of this invention will now be described with reference to FIGS. 3A to 3F, and FIGS. 4A and 4B. FIGS. 3A to 3F are schematic views showing steps to fabricate a chip for use by a surface acoustic wave device according to the embodiment 3. FIGS. 4A and 4B are perspective views illustrating respectively typical states of the chips in FIGS. 3D and 3F as they are being fabricated.

Figure 3A:
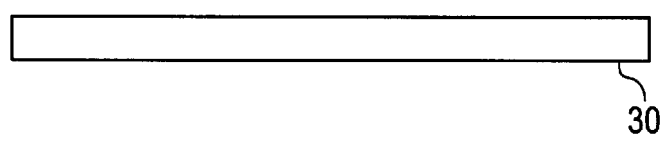
Figure 3B:
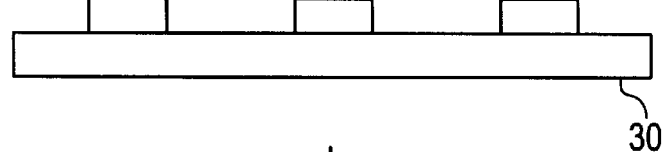
Figure 4A:
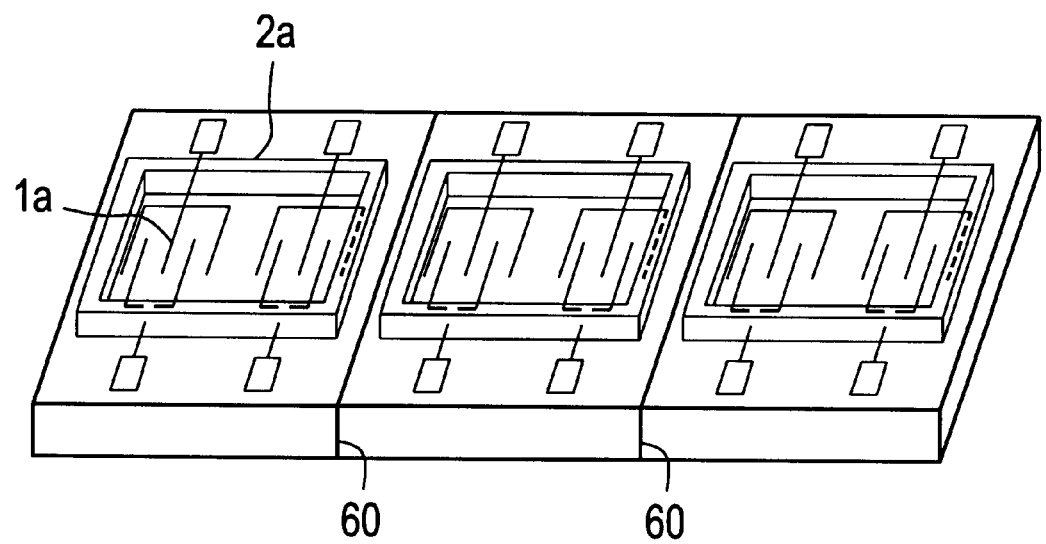
Figure 4B:
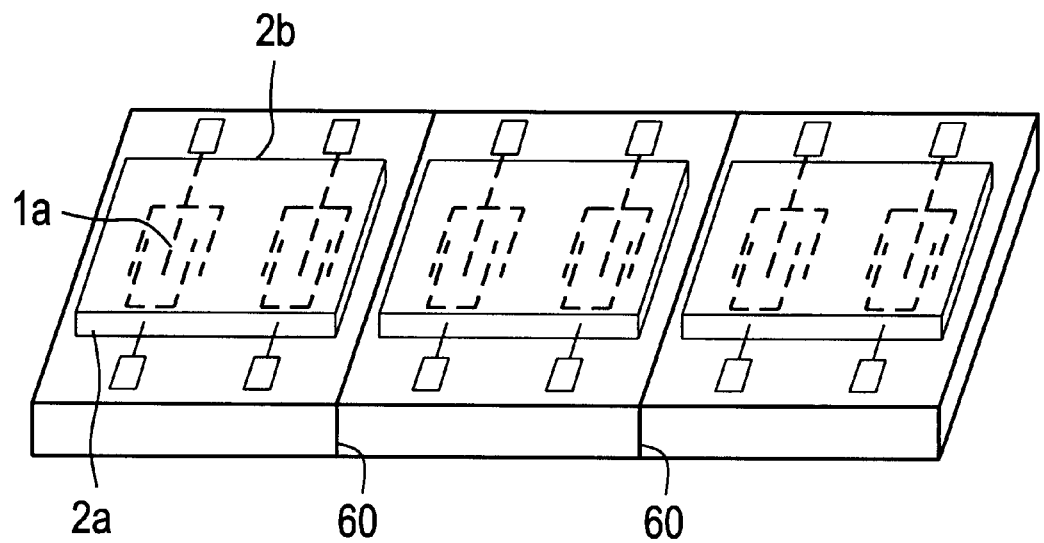

FIG. 3A shows a wafer 30. On the wafer 30, a plurality of functional portions 1a are formed through conductor patterning at suitable intervals as indicated in FIG. 3B.

Figure 3C:
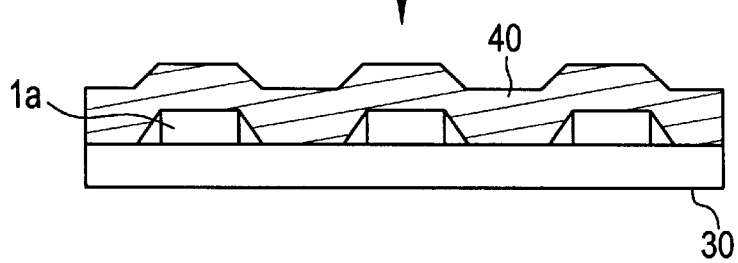
Figure 3D:
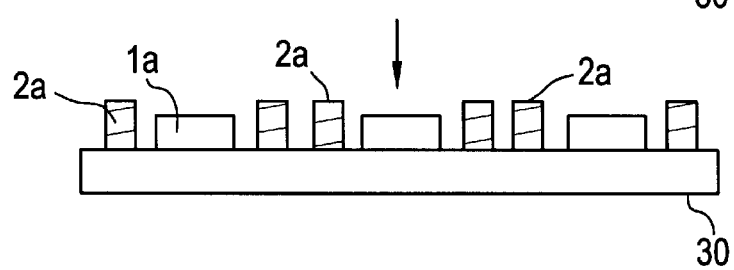

A photosensitive film 40 is then deposited on all functional portions 1a on the wafer 30 as illustrated in FIG. 3C. With the film 40 in place, a frame-like first insulating film 2a is formed by photolithography so as to surround each functional portion as shown in FIGS. 3D and 4A. FIG. 4A depicts a case in which two functional portions 1a are surrounded by the first insulating film 2a.

Figure 3E:
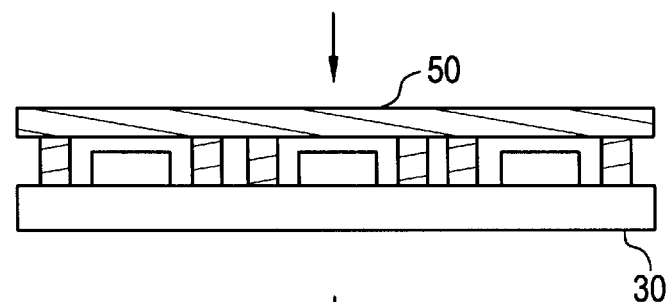
Figure 3F:
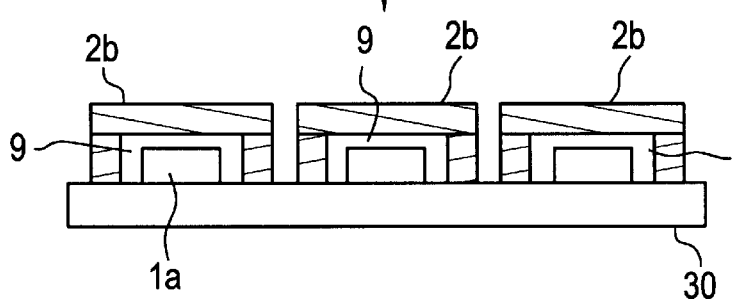

Thereafter, a single photosensitive film 50 is deposited on the first insulating film 2a over the wafer as illustrated in FIG. 3E. The process creates a suitable hollow portion 9 between each functional part 1a and the photosensitive film 50. With the hollow portions thus provided, a lid-like second insulating film 2b is formed also by photolithography (as in FIGS. 3D and 4A) to cover each of the first insulating films 2a as depicted in FIGS. 3F and 4B.

After that, the wafer is diced up along separation lines 60 separating chips as shown in FIGS. 4A and 4B, whereby the individual chips are formed.

As described, the embodiment 3 of the invention has its first and second insulating films fabricated finely, precisely and efficiently, the films offering the same effects as those of the first and the embodiment 2.

Embodiment 4

Figure 5:
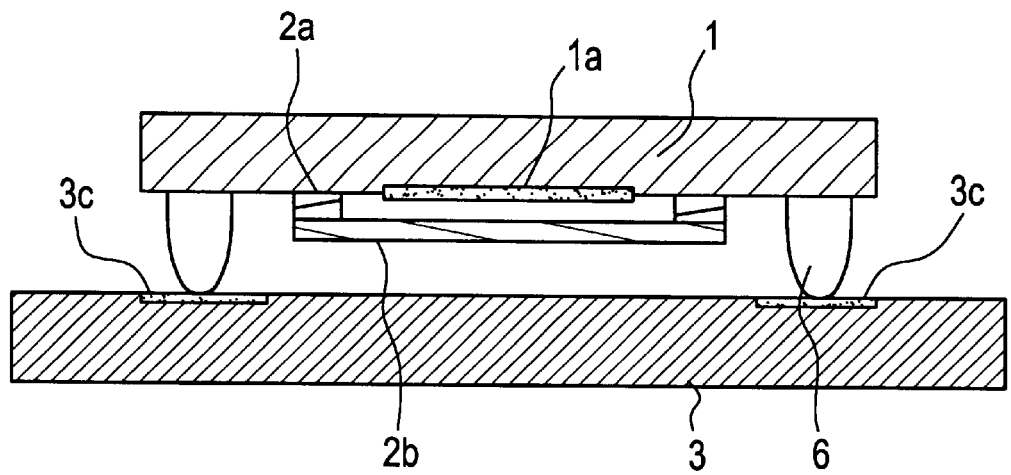

An embodiment 4 of this invention will now be described with reference to FIG. 5. FIG. 5 is a cross-sectional view of a surface acoustic wave device according to embodiment 4. In FIG. 5, those parts with their counterparts already shown in FIG. 1 are given the same reference numerals, and descriptions of such parts are omitted where they are repetitive.

In FIG. 5, reference numeral 6 denotes bump electrodes constituting external connectors of the functional portion 1a. The chip 1, with its functional portion 1a capped by the first and the second insulating film 2a and 2b, is connected by the bump electrodes 6 to suitable connectors 3c on the circuit substrate 3 in flip-chip bonding fashion.

The makeup above allows the embodiment 4 to be a smaller surface acoustic wave device than the embodiment 1 while offering the same effects as those of the latter.

If part or all of the chip is covered with an appropriate insulating resin as is the case with the embodiment 2, the embodiment 4 may be fabricated as a surface acoustic wave device with significantly enhanced reliability.

Embodiment 5

Figure 6:
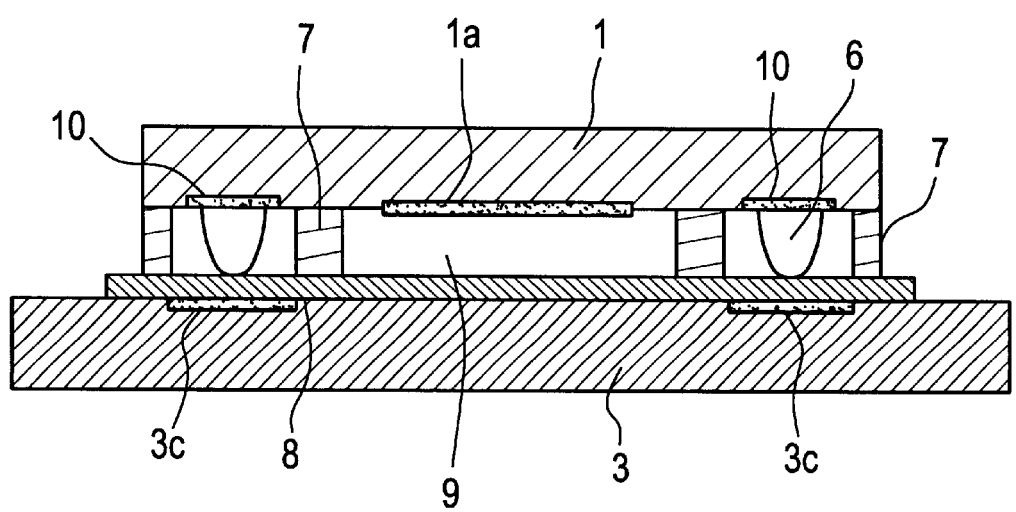
Figure 7:
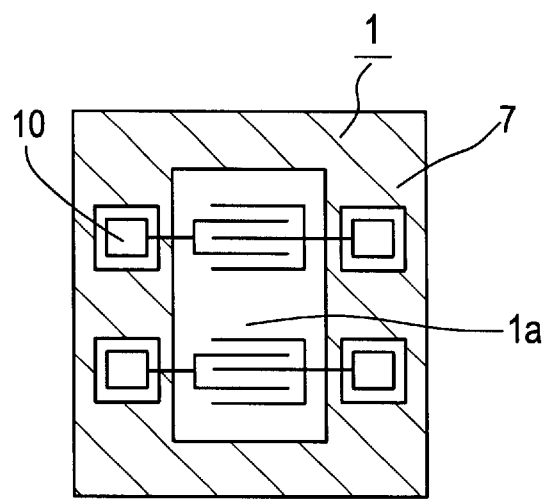

An embodiment 5 of this invention will now be described with reference to FIGS. 6 and 7. FIG. 6 is a cross-sectional view of a surface acoustic wave device according to the embodiment 5. FIG. 7 is a plan view of a chip 1 used by the embodiment 5.

In FIGS. 6 and 7, those parts with their counterparts already shown in FIG. 1 are given the same reference numerals, and descriptions of such parts are omitted where they are repetitive.

As shown in FIGS. 6 and 7, an insulating film 7 is formed over the chip 1 except where there are at least the functional portion 1a and the electrode pads 10 constituting external connectors of the functional portion 1a. The thickness of the insulating film 7 should preferably be made equal to or slightly less than that of the bump electrodes 6 as depicted in FIG. 6.

The chip 1 is mounted on the bump electrodes 6 so that a hollow portion 9 is secured over its functional portion 1a as shown in FIG. 6. The chip 1 is then connected to suitable connectors 3c on the circuit substrate 3 in flip-chip bonding fashion, with an anisotropic conductor 8 interposed between the bump electrodes 6 and the connectors 3c.

In the embodiment 5 of the above constitution, the chip 1 is bonded to the circuit substrate 3 not only via the bump electrodes 6 but also through the insulating film 7. This setup prevents junction stress from getting concentrated locally, thereby implementing a surface acoustic wave device with its bump electrodes 6 offering high connection reliability.

If part or all of the chip is covered with an appropriate insulating resin as is the case with the embodiment 2, the embodiment 5 may also be fabricated as a surface acoustic wave device with significantly enhanced reliability.

Furthermore, if the insulating film 7 is formed by photolithography using a photosensitive material as with the embodiment 3, the embodiment 5 will have its insulating film 7 fabricated finely, precisely and efficiently.

Embodiment 6

Figure 8:
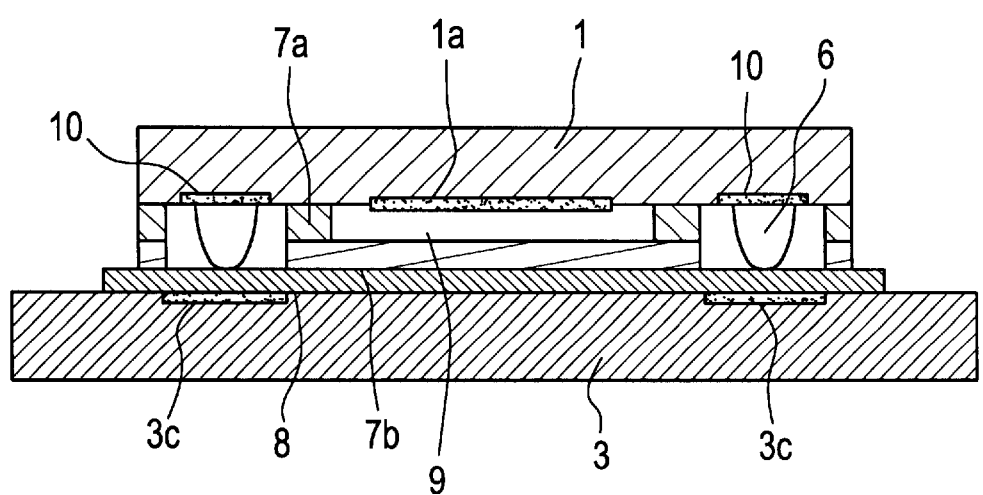

An embodiment 6 of this invention will now be described with reference to FIG. 8. FIG. 8 is a cross-sectional view of a surface acoustic wave device according to embodiment 6. In FIG. 8, those parts with their counterparts already shown in FIG. 1 are given the same reference numerals, and descriptions of such parts are omitted where they are repetitive.

As shown in FIG. 8, a first insulating film 7a is formed over the chip 1 except where there are at least the functional portion 1a and bump electrode pads 10. A second insulating film 7b is deposited on the first insulating film 7a. The functional portion 1a of the chip 1 is covered with the first and the second insulating film 7a and 7b in such a manner that a hollow portion 9 is secured over the surface of the functional part 1a. Those parts of the films 7a and 7b which correspond to the electrode pads 10 are removed so that the bump electrodes 6 are exposed. The combined thickness of the first and the second insulating film 7a and 7b should preferably be made identical to or slightly less than the height of the bump electrodes 6.

The chip 1 is connected by the bump electrodes 6 to suitable connectors 3c on the circuit substrate 3 in flip-chip bonding fashion, with the anisotropic conductor 8 interposed between the bump electrodes 6 and the connectors 3c.

The embodiment 6 of the above constitution provides the same effects as the embodiment 5. Because the crucially important functional portion 1a is protected by the first and the second insulating film 7a and 7b with the hollow portion interposed therebetween, the above makeup allows the chip 1 to be fabricated in a secure manner with little risk of getting the functional portion 1a inadvertently damaged during the process.

Because the first and the second insulating film 7a and 7b seal the functional portion 1a in a simplified fashion, it is not mandatory, as with conventional surface acoustic wave devices, to provide costly airtight sealing on the functional portion. This makes it possible to manufacture an inexpensive yet viable surface acoustic wave device.

If part or all of the chip is covered with an appropriate insulating resin as is the case with the embodiment 2, the embodiment 6 may also be fabricated as a surface acoustic wave device with significantly enhanced reliability.

Furthermore, if the first and the second insulating film 7a and 7b are formed by photolithography using a photosensitive material as with the embodiment 3, the embodiment 6 will have its first and second insulating films 7a and 7b fabricated finely, precisely and efficiently.

Embodiment 7

An embodiment 7 of this invention will now be described with reference to. FIGS. 9A to 9F. FIGS. 9A to 9F are schematic views showing steps to fabricate a chip for use by a surface acoustic wave device, the steps constituting a method according to embodiment 7.

Figure 9A:
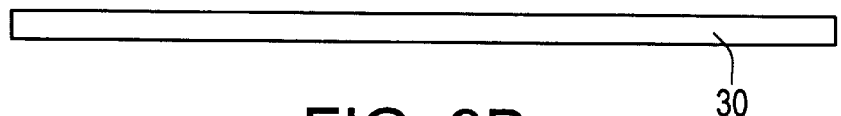
Figure 9B:
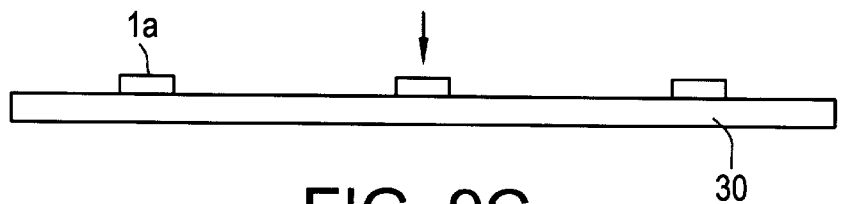

FIG. 9A shows a wafer 30. On the wafer 30, a plurality of functional portions 1a are formed through conductor patterning at suitable intervals as depicted in FIG. 9B.

Figure 9C:
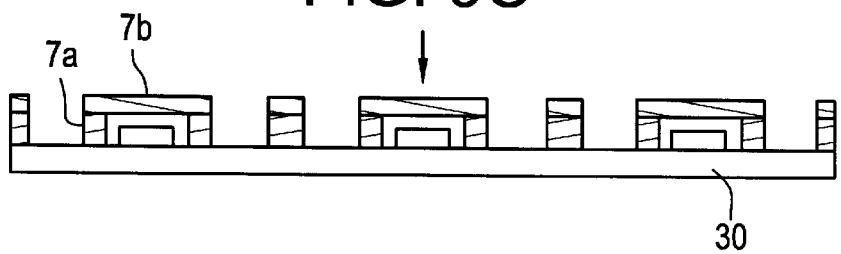

A first insulating film 7a made illustratively of a photosensitive material is then deposited on the wafer surface comprising the functional portions 1a. The first insulating film 7a is shaped as shown in FIG. 9C by photolithography, with the functional portions 1a and electrode pads for bump electrodes excluded.

In the state above, a second insulating film 7b composed of a photosensitive material is further deposited on the first insulating film 7a. A lid covering the functional portions 1a is formed by similar photolithography. With the electrode pads for bump electrodes excluded, the second insulating film 7b is then formed as shown in FIG. 9C.

Figure 9D:
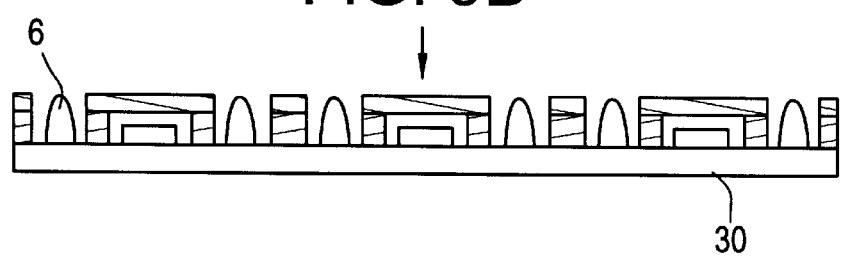

The bump electrodes 6 corresponding to each of the functional portions are furnished as illustrated in FIG. 9D. At this point, the combined thickness of the first and the second insulating film 7a and 7b should preferably be made identical to or slightly less than the height of the bump electrodes 6.

Figure 9E:
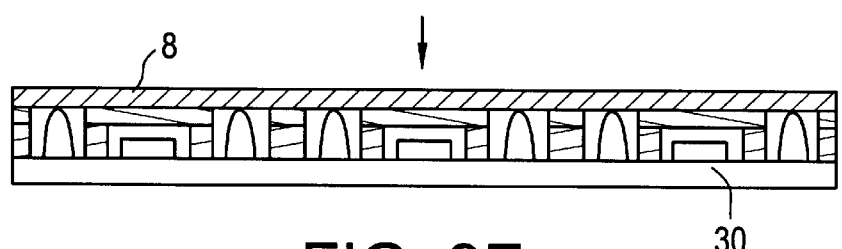

Thereafter, as shown in FIG. 9E, a single anisotropic conductor 8 is furnished so as to cover all functional portions and their bump electrodes 6, the conductor being in contact with the bump electrodes.

Figure 9F:
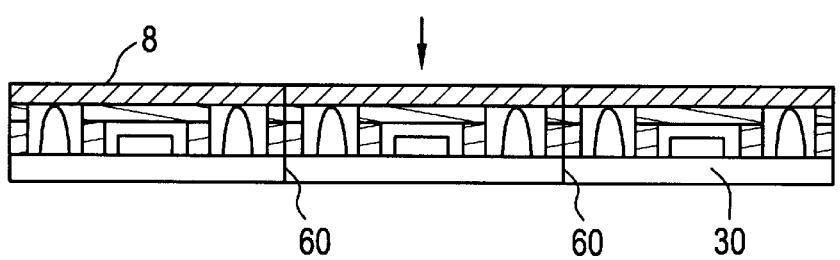

In this state, the wafer is diced up along separation lines 60 separating chips as shown in FIG. 9F, whereby the individual chips are formed.

By use of the above method according to embodiment 7, it is possible to fabricate efficiently a surface acoustic wave device offering the same effects as those of the fifth and the embodiment 6.

The surface acoustic wave device of the present invention has surface acoustic wave elements mounted on a circuit substrate, each of the surface acoustic wave elements comprises a piezoelectric substrate, a functional portion which is formed on a principal plane of the piezoelectric substrate and which has driving electrodes for driving surface waves in a predetermined direction over a surface of the piezoelectric substrate, a frame-like first insulating film furnished on the principal plane of the piezoelectric substrate so as to surround the functional portion and a lid-like second insulating film for covering the driving electrodes and surface wave propagation paths of the functional portion while securing a predetermined space over the functional portion. This structure provides a hollow portion over the surface of the functional portions so that the device is fabricated in secure, damage-free fashion.

In the surface acoustic wave device of the present invention, the surfaces of the surface acoustic wave elements may be covered with an insulating resin. This makes it possible to fabricate a more reliable surface acoustic wave device than before.

The surface acoustic wave device of the present invention may further comprise bump electrodes which are formed on either one principal plane or another principal plane of the piezoelectric substrate and which constitute external connectors of the surface acoustic wave elements, wherein the surface acoustic wave elements are connected via the bump elements to the circuit substrate in flip-chip bonding fashion. This preferred structure helps reduce the size of the surface acoustic wave device.

The surface acoustic wave device of the present invention has surface acoustic wave elements mounted on a circuit substrate, each of the surface acoustic wave elements comprises a piezoelectric substrate, a functional portion which is formed on a principal plane of the piezoelectric substrate and which has driving electrodes for driving surface waves in a predetermined direction over a surface of the piezoelectric substrate, bump electrodes which are formed on the principal plane of the piezoelectric substrate and which constitute external connectors of the functional portion and an insulating film deposited on the principal plane of the piezoelectric substrate except where there exist at least the functional portion and the bump electrodes, wherein the surface acoustic wave elements are connected via the bump electrodes to the circuit substrate in flip-chip bonding fashion, with an anisotropic conductor interposed between the bump electrodes and the circuit substrate. This structure prevents junction stress from getting concentrated locally on the chip, allowing the bump electrodes to offer high connection reliability.

The surface acoustic wave device of the present invention has surface acoustic wave elements mounted on a circuit substrate, each of the surface acoustic wave elements comprises a piezoelectric substrate, a functional portion which is formed on a principal plane of the piezoelectric substrate and which has driving electrodes for driving surface waves in a predetermined direction over a surface of the piezoelectric substrate, a first insulating film deposited on the principal plane of the piezoelectric substrate except where there exist at least the functional portion and bump electrodes and a second insulating film deposited on the first insulating film so as to secure a predetermined space over the functional portion while covering the driving electrodes and surface wave propagation paths of the functional portion except where there exist at least the bump electrodes, wherein the surface acoustic wave elements are connected via the bump electrodes to the circuit substrate in flip-chip bonding fashion, with an anisotropic conductor interposed between the bump electrodes and the circuit substrate. This structure reinforces protection of the functional portions and eliminates the need for providing their airtight sealing. The resulting device is inexpensive and, with junction stress dispersed over the chip, fabricated in a way that allows its bump electrodes to offer high connection reliability.

In the surface acoustic wave device of the present invention, the first and the second insulating film of the surface acoustic wave device may be composed of photosensitive films and formed by photolithography. This structure allows the insulating films to be fabricated finely, precisely and efficiently.

A method for fabricating a surface acoustic wave device of the present invention comprises the steps of forming functional portions of a plurality of surface acoustic wave elements on one principal plane of a piezoelectric substrate, the function portions including driving electrodes for driving surface waves in a predetermined direction over a surface of the piezoelectric substrate, depositing a first insulating film on the principal plane of the piezoelectric substrate except where there exist at least the functional portions and electrode pads for use by bump electrodes, depositing on the first insulating film a second insulating film in lid fashion covering each of the functional portions except each of the electrode pads so as to secure a predetermined space over the functional portions while covering the driving electrodes and surface wave propagation paths of the functional portions, furnishing each of the functional portions with the bump electrodes constituting external connectors of the functional portions on the principal plane of the piezoelectric substrate, providing a single anisotropic conductor so as to cover the plurality of functional portions and each of the bump electrodes, connecting the bump electrodes to the circuit substrate in flip-chip bonding fashion and separating the surface acoustic wave elements into individual elements. This method fabricates the inventive surface acoustic wave device efficiently.

Preferably, the inventive method may further comprise the steps of having the first and the second insulating film composed of photosensitive films and formed by photolithography. The additional steps make it possible to fabricate the insulating films finely, precisely and efficiently.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-282814 filed on Oct. 5, 1998 including specification, claims, drawings and summary are incorporated herein by reference in its entirety.

What is claimed is:

1. A surface acoustic wave device, comprising:

a circuit substrate;

a plurality of terminals formed on a surface of said circuit substrate;

a piezoelectric substrate having a principal plane facing said surface of said circuit substrate;

a functional portion formed on said principal plane of said piezoelectric substrate and which has driving electrodes for driving surface waves in a predetermined direction over a surface of said piezoelectric substrate;

a plurality of bump electrodes formed on said principal plane of said piezoelectric substrate so as to be electrically connected to said functional portion, and projecting from said principal plane of said piezoelectric substrate to electrically contact said plurality of terminals;

a first insulating film formed on said principal plane of said piezoelectric substrate except for areas over said functional portion and said bump electrodes;

a second insulating film formed on said first insulating film except for areas over said bump electrodes, to thereby form a protective space over said functional portion; and an anisotropic conductor film formed between said circuit substrate and said second insulating film, said anisotropic conductor film extending over an area at least corresponding to said piezoelectric substrate and contacting said plurality of bump electrodes, said second insulating film, and said surface of said circuit substrate including said plurality of terminals.

2. The surface acoustic wave device of claim 1, wherein said first and second insulating films are composed of photosensitive films and are formed by photolithography.

3. A surface acoustic wave device, comprising:

a circuit substrate;

a plurality of terminals formed on a surface of said circuit substrate;

a piezoelectric substrate having a principal plane facing said surface of said circuit substrate;

a functional portion formed on said principal plane of said piezoelectric substrate and which has driving electrodes for driving surface waves in a predetermined direction over a surface of said piezoelectric substrate;

a plurality of bump electrodes formed on said principal plane of said piezoelectric substrate so as to be electrically connected to said functional portion, and projecting from said principal plane of said piezoelectric substrate to electrically contact said plurality of terminals;

a first insulating film formed on said principal plane of said piezoelectric substrate except for areas over said functional portion and said bump electrodes; and an anisotropic conductor film formed on said circuit substrate and extending over an area at least corresponding to said piezoelectric substrate and contacting said plurality of bump electrodes and said plurality of terminals; wherein a hollow portion for protectively enveloping said functional portion is formed by said first insulating film and said anisotropic conductor film.

4. The surface acoustic wave device according to claim 3, wherein said first insulating film is composed of photosensitive film and is formed by photolithography.

* * * * *